It

United States Patent
Takenaka et al.

[11] Patent Number: 5,915,999
[45] Date of Patent: Jun. 29, 1999

[54] PRESS-FIT CONNECTING PIN AND ELECTRONIC DEVICE USING THE SAME

[76] Inventors: Noriaki Takenaka, 3-23-13, Kita-Koiwa, Edogawa-ku, Tokyo; Noriharu Kurokawa, 3-1-18, Sagami-Ohno, Sagamihara-shi, Kanagawa; Takinori Sasaki, 5095-2, Soya, Hadano-shi, Kanagawa, all of Japan

[21] Appl. No.: 08/875,044

[22] PCT Filed: Jan. 30, 1996

[86] PCT No.: PCT/US96/01048
    § 371 Date: Jul. 8, 1996
    § 102(e) Date: Jul. 8, 1996

[87] PCT Pub. No.: WO96/24175
    PCT Pub. Date: Aug. 8, 1996

[30] Foreign Application Priority Data

Jan. 31, 1995 [JP] Japan ................... 7-034518

[51] Int. Cl.[6] .................. H01R 13/42; H01R 9/09
[52] U.S. Cl. .................. 439/751; 439/82; 439/84
[58] Field of Search ............ 439/571, 82, 84; 339/220, 221

[56] References Cited

U.S. PATENT DOCUMENTS 3,444,617  5/1969  Stricker et al. .................. 29/626
3,827,004  7/1974  Van Heuvel et al. ........... 339/221 R
4,186,982  2/1980  Cobaugh et al. ................. 339/17 C
5,002,507  3/1991  Sitzler ................................. 439/751

FOREIGN PATENT DOCUMENTS

0340574A3  11/1989  European Pat. Off. ........ H01R 9/09
966.327    10/1950  France ........................... H01R 9/09
58-172881  3/1958   Japan ........................... H01R 23/72
58-14683   1/1983   Japan ........................... H01R 13/41
58-154572  10/1983  Japan ........................... H01R 9/09
58-157974  10/1983  Japan ........................... H01R 9/09
60-45463   3/1985   Japan ........................... H05K 3/32
60-172370  11/1985  Japan ........................... H05K 1/18
62-5575    1/1987   Japan ........................... H01R 9/09

Primary Examiner—Paula Bradley
Assistant Examiner—Alexander Gilman
Attorney, Agent, or Firm—Katherine A. Nelson; Anton P. Ness

[57] ABSTRACT

The present invention is directed to a small-size press-fit connecting pin which can be press-fitted and connected in the through-hole of a circuit board by means of a low insertion force, and an electronic device using this press-fit connecting pin. The press-fit connecting pin (10) has a shaft portion with a diameter of approximately 0.4 mm, and has a first section (42) and second section (43) (along the length of the shaft portion) whose length is less than the thickness of the circuit board (100) in which the through-hole (101) is formed. Projecting strips (45, 46) which run in the direction of length are formed on the outer surfaces of the respective sections (42 and 43). The projecting strips (45 and 46) formed on the first section (42) and second section (43) are formed in mutually different angular positions.

20 Claims, 3 Drawing Sheets

PRESS-FIT CONNECTING PIN AND ELECTRONIC DEVICE USING THE SAME

FIELD OF THE INVENTION

The present invention concerns a pin that is press-fitted and connected to electrical terminals, especially plated through-holes, and electronic devices such as pin grid arrays (PGA's), IC devices and electrical connectors or the like that use such a press-fit connecting pin.

BACKGROUND OF THE INVENTION

Electronic circuit parts that are attached to circuit boards during use, such as PGA's, IC devices, electrical connectors, switches and the like (hereafter referred to collectively as "electronic devices") have numerous terminals or pins. Such pins are connected to conductive pads or conductive paths of circuit boards during use.

In the case of such electronic devices, the number of pins has increased and the pins have been installed at a higher density (smaller pitch), as the size of electronic equipment has been reduced and the performance of such equipment has been improved. Soldering is a common technique used to effect electrical connection of such numerous high-density pins to circuit boards. In the case of high-density pins, however, not only is soldering difficult but a drop in reliability caused by solder bridges or the like also becomes a problem. Furthermore, it is extremely difficult to remove electronic devices once these devices have been soldered. Accordingly, such soldered devices are difficult to maintain and service.

In order to overcome the drawbacks of soldering such as these, direct electrical connections achieved by press-fitting pins into circuit boards that have plated through-holes have been proposed. Such techniques have spread widely, especially in the field of communications equipment.

A compliant pin terminal known as the ACTION PIN® terminal has been commercially marketed by AMP Incorporated as one type of such press-fit connecting pin. This compliant pin is constructed so that portions of the shaft of the pin are sheared in the axial direction and mutually offset along the shear surfaces, as disclosed, for example, in U.S. Pat. No. 4,186,982. Accordingly, this pin can be press-fitted relatively smoothly against the inside walls of plate through-holes, so that highly reliable electrical connections can be achieved and maintained with a large contact pressure and without damaging the plating layer. A similar compliant pin is also disclosed in Japanese Utility Model Application Kokai No. 58-14683, and a pin split into three parts is disclosed in Japanese Utility Model Application Kokai No. 60-45463 and elsewhere.

On the other hand, compliant pins or press-fit pins that have been given a deformable cross-sectional shape by applying pressure or mechanical working without shearing the shaft portion of the pin are disclosed in Japanese Patent Publication No. 62-5575, Japanese Utility Model Publication No. 58-154572, Japanese Utility Model Publication No. 60-172370, Japanese Utility Model Publication No. 58-157974, Japanese Patent No. 58-172881 and elsewhere.

The conventional compliant pins described above are sufficient for certain specified applications but are difficult or impossible to use in the case of small-size high-density pins with extremely slender shafts, such as those having a diameter of approximately 0.4 mm, which are required by recent electronic devices. The reasons for this are as follows:

First, in the case of compliant pins in which the shaft portion is sheared or offset so that the shaft portion is split into two or three parts as described above, such working cannot be applied to fine pins that have a diameter of approximately 0.4 mm. Furthermore, when conventional compliant pins that have been worked so that the cross-sectional shape of the pin is deformable are used in through-holes which have a diameter of approximately 0.4 mm, the amount of deformation is small so that an excessive amount of insertion force is required for press-fitting. As a result, the pins themselves undergo buckling deformation. Furthermore, the plating layers of the through-holes may be destroyed, or, depending on the dimensional working tolerances of the through-holes and pins, it may be impossible to obtain electrical connections of sufficiently high reliability.

U.S. Pat. No. 3,827,004 discloses a press-fit connecting pin including a shaft having deformable strips projecting radially therefrom at separate locations. The locations are angularly positioned with respect to one another and are dimensioned to engage the inside walls of the through-hole when inserted therein. The shaft of the fins is substantially square and includes pairs of collapsible pins that bend toward each other when the pin is inserted into a through-hole.

SUMMARY OF THE INVENTION

Accordingly, one object of the present invention is to provide a press-fit connecting pin [a] that can be press-fitted relatively easily in through-holes which have a relatively large dimensional tolerance, [b] that makes it possible to achieve a highly reliable electrical connection, and [c] that can be used in the case of small-size high-density pins.

Another object of the present invention is to provide an electronic device that has numerous small-size high-density press-fit connecting pins and that has press-fit connecting pins with a low insertion force and a high degree of reliability.

In order to eliminate the above mentioned drawbacks of conventional press-fit connecting pins and achieve the above mentioned technical objects, the press-fit connecting pin of the present invention is characterized by the fact that the shaft portion includes two sections, each section having projecting strips formed longitudinally therealong.

Furthermore, the press-fit connecting pin of the present invention is characterized by the fact that the pin has a substantially circular shaft portion having fist and second sections formed longitudinally therealong. Each section includes a pair of opposed substantially parallel formed on two sides thereof. The deformable strips are formed at the approximate centers at the parallel surfaces and project in a radial confirmation outwardly beyond the diameter of the remaining shaft portion.

Furthermore, the electronic device of the present invention is characterized by the fact that the device uses numerous press-fit connecting pins having the construction described above, so that highly reliable electrical connections with plated through-holes formed in circuit boards can be achieved by means of a relatively low insertion force.

Embodiments of the press-fit connecting pin of the present invention and an electronic device using the same will be described by way of example with reference to the following drawings.

DETAILED DESCRIPTION OF EMBODIMENTS OF THE INVENTION

Figure 1:
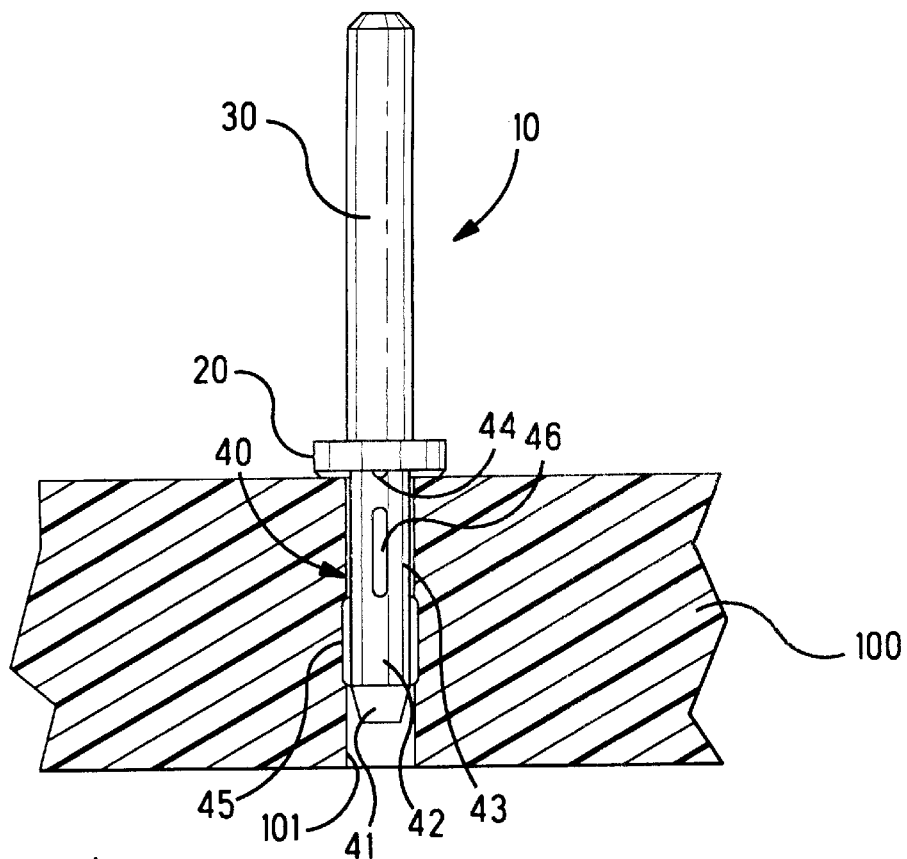
FIG. 1 is a front view that shows the overall construction of a preferred embodiment of the press-fit connecting pin of the present invention and the connection of this pin to a circuit board.

First, the overall construction of a press-fit connecting pin constituting a preferred embodiment of the present invention will be described with reference to FIG. 1. FIG. 1 is a side view of a press-fit connecting pin 10. This press-fit connecting pin 10 is preferably made of a copper alloy such as zirconium-copper or the like or other electrically conductive alloy such as one sold under the trade name of KOVAR®. The overall shape of the pin is substantially cylindrical. The pin 10 has a large-diameter flange portion 20 located roughly midway along the pin; furthermore, the pin 10 has a substantially uniform cylindrical portion 30 on one side of the flange portion 20 and a press-fit connecting portion 40, which is press-fitted into a plated through-hole 101 formed in a circuit board 100 on the other side of the flange portion 20. In this specific embodiment, the thickness of the circuit board 100 is approximately 2.0 mm, and the internal diameter of the through-hole 101 is 0.45±0.05 mm. The overall length of the press-fit connecting pin 10 is 4.8 mm, the length and diameter of the cylindrical portion 30 are 3.1 mm and 0.45 mm, respectively, the diameter of the flange portion 20 is 0.9 mm, and the length of the press-fit connecting portion 40 is 1.7 mm. Of course, it should be noted that these dimensions and shapes may be appropriately selected in accordance with the intended use of the pin.

Next, the press-fit connecting portion 40 that constitutes the essential part of the press-fit connecting pin 10 of the present invention will be described. The press-fit connecting portion 40 in this specific embodiment has [a] a tapered end section 41, [b] a first section 42 and second section 43 that form a continuation of the end section 41, each having a length of approximately 0.6 mm, and if necessary, [c] a plurality of radial ribs 44, for example four, that are formed on the press-fit connecting portion side of the flange portion 20.

The first section 42 and second section 43 of the press-fit connecting portion 40 have substantially the same shape, and each of these portions has two or more projecting strips 45 or 46 formed on the outer circumference of the pin. The respective projecting strips 45 and 46 of the first section 42 and second section 43 are formed in mutually different angular positions; for example, the projecting strips 45 and 46 in FIG. 1 are formed in a perpendicular relationship.

Figure 2:
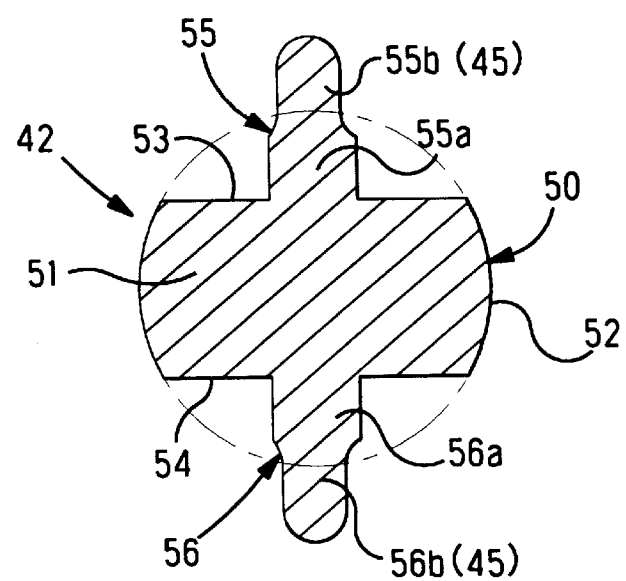
FIG. 2 is a cross sectional view of one example of the press-fit connecting portion of the press-fit connecting pin shown in FIG. 1.

One example of the first section 42 of the press-fit connecting portion 40 of the press-fit connecting pin 10 is shown in cross-section in FIG. 2. This first section 42 in this example has [a] a main body or shaft portion 50 that has circular-arc-formed sections 51, 52 separated by a diameter of approximately 0.4 mm and parallel surfaces 53, 54 separated by a distance of 0.2 mm, and [b] projections 55, 56 that are formed at the approximate centers of the two parallel surfaces 53, 54 and that extend outward in a substantially perpendicular direction (i.e. radially) from these parallel surfaces 53, 54. The projections 55, 56 are formed from base parts 55a, 56a that have a width of 0.1 mm and deformable parts 55b, 56b that have a width of approximately 0.05 mm, which extend outward from the tips of the base parts 55a, 56a (these deformable parts are hereafter referred to as "projecting strips", since these parts correspond to the projecting strips 45, 46 in FIG. 1). The tips of the base parts 55a, 56a are positioned on the circumference of a circle having a diameter of approximately 0.4 mm, which is an inner circle having the same diameter as the circle formed by the circular-arc-form parts 51, 52 of the main body part 50. Furthermore, the tips of the projecting strips 55b, 56b are positioned on the circumference of an outer circle with a diameter of approximately 0.56 mm that is centered on the axial center of the main body portion 50.

Next, the press-fit connecting pin 10 shown in FIGS. 1 and 2 will be described with reference to the cross-sectional view shown in FIG. 3, which illustrates the press-fitting of the pin 10 in the through-hole 101 of the circuit board 100. Furthermore, in FIG. 3, the first section 42 is indicated by a solid line and the second section 43 is indicated by a broken line, thus illustrating the positional relationship of the two sections. Furthermore, the dimensions and shapes of the through-hole 101 in the circuit board 100 and the respective sections of the press-fit connecting portion 40 of the press-fit connecting pin 10 are assumed to be as in the example described above.

Figure 3:
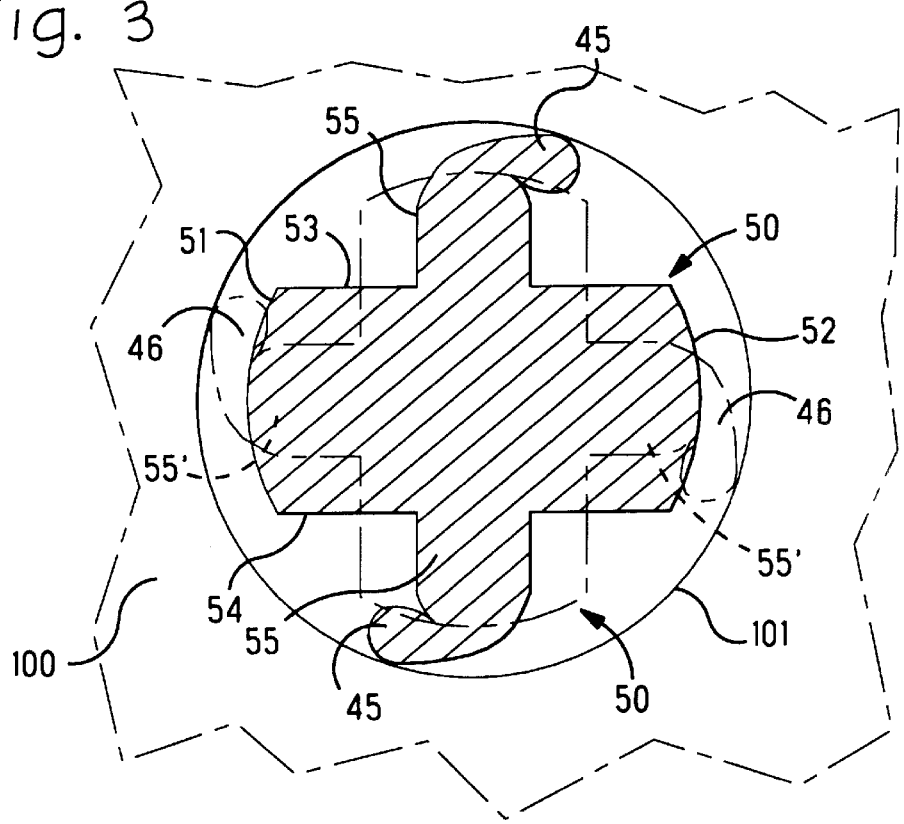
FIG. 3 is a cross sectional view that shows the press-fit connecting pin of FIGS. 1 and 2 press-fitted in the through-hole of a circuit board.

As is seen from FIG. 3, the inner circle (0.4 mm) formed by the two circular-arc-form parts 51, 52 of the main body part 50 is smaller than the diameter (center value: 0.45 mm) of the through-hole 101; accordingly, the main body portion 40 can be inserted without making substantial contact with the inside walls of the through-hole 101. However, since the tips of the projecting strips 55b, 56b are positioned on the circumference of the outer circle described above, which has a diameter of 0.56 mm, the projecting strips 55b, 56b contact the inside walls of the through-hole 101 and are deformed. The amount of deformation depends on the dimensional relationship with the through-hole 101. Furthermore, since the second section 43 of the press-fit connecting portion 40 is in a perpendicular relationship with the first section 42, the projecting strips 45 of the second portion 42 also contact the inside walls of the through-hole 101 and are deformed.

It should be noted here that since the projecting strips of the press-fit connecting pin 10 are deformable, even if the plating layer of the through-hole 101 should be scraped by the projecting strips 45, 46, this scraping will occur in only a portion of the total length of the plating layer; furthermore, since the projecting strips 45, 46 of the first section 42 and second section 43 are mutually offset, there is no danger of damage to the through-hole 101 (i.e., no danger of a loss of conductivity). Furthermore, it should also be noted that since the projecting strips 45, 46 have a width of approximately 0.05 mm as described above, the insertion force required for the insertion of the press-fit connecting pin 10 into the through-hole 101 can be kept at a sufficiently low value.

As best seen in FIG. 1, the flange portion 20 of the press-fit connecting pin 10 forms a stop surface with which the pin 10 engages the surface of the circuit board 100. Furthermore, the radial ribs 44 on the outside surface of the flange portion 20 provide gas escape paths when the pin 10 is soldered to the circuit board 100 by surface mount techniques (SMT), such as reflow soldering, so that a good electrical connection is achieved. However, the radial ribs 44 are not an essential part of the present invention and may be omitted depending on the intended use of the pin 10.

The projecting strips 45, 46 of the press-fit connecting pin 10 shown in FIGS. 1 and 2 are formed radially with respect to the axial center of the main body part 50; accordingly, these projecting strips 45, 56 undergo little deformation during press-fitting in the through-hole 101 of the circuit board 100 and bite into the inside walls of the through-hole 101 as knife edges. However, the projecting strips 45, 46 are not necessarily limited to projecting strips that extend radially, i.e., in directions perpendicular to the parallel surfaces 53, 54. Alternative embodiments of the projecting strips 45, 46 will be described with reference to FIGS. 4 through 7.

Figure 4:
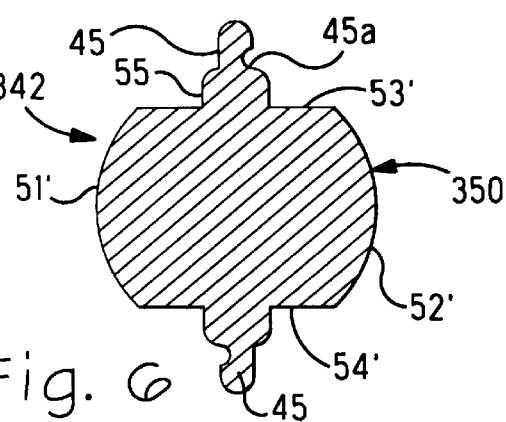
FIG. 4 is a cross-sectional view of a first alternative embodiment of the press-fit connecting portion of the pin.
Figure 5:
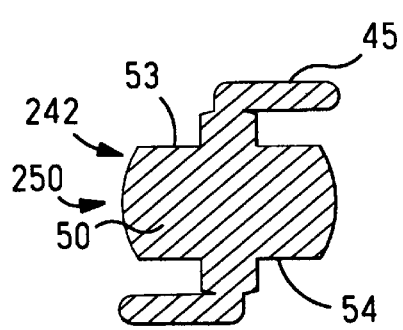
FIG. 5 is a cross-sectional view of a second alternative embodiment of the press-fit connecting portion of the pin.

In the alternative embodiments 142, 242 shown in FIGS. 4 and 5, the dimensions and shapes of the main body part 150, 250 and base parts 55a, 56a are the sane as those of the corresponding parts shown in FIG. 2. However, these examples are characterized by the fact that the projecting strips 45, 46 (not shown) are inclined at specified angles from the radial direction, so that the overall cross-sectional shape of the projecting strips is roughly an "f" shape. Specifically, the projecting strips shown in FIG. 4 have an angle of inclination of approximately 45 degrees with respect to the radial direction, while the projecting strips shown in 5 are inclined at roughly 90 degrees (i.e., are parallel to the parallel surfaces 53, 54). In both of these alternative embodiments 142, 242, the tips of the projecting strips are positioned on the circumference of an outer circle with a diameter of 0.56 mm as in the case of the projecting strips in FIG. 2. It should be noted that the projecting strips in both of these modified examples deform relatively easily and that, when the pin 10 is press-fitted into the through-hole 101 of the circuit board 100, the tips of the projecting strips receive a force that bends the tips inwardly from the circumference of the outer circle along the inside walls of the through-hole 101. Accordingly, the following advantages are obtained: the insertion force required in order to insert the press-fit connecting pin 10 into the through-hole 101 is small, so that there is little damage to the plating layer on the inside walls of the through-hole 101 and, furthermore, a good electrical connection can be obtained with plating layers that show variation as a result of the dimensional tolerance. Next, the alternative embodiments 342, 442 illustrated in FIGS. 6 and 7 have dimensions and shapes that are slightly different from those of the embodiments of FIGS. 4 and 5 described above. Here, the circular-arc-form surfaces 51', 52' of the main body part 350, 450 are positioned on the circumference of an inner circle that has a diameter of 0.42 mm and the distance between the parallel surfaces 53', 54' is 0.3 mm.

Figures 6, 7:
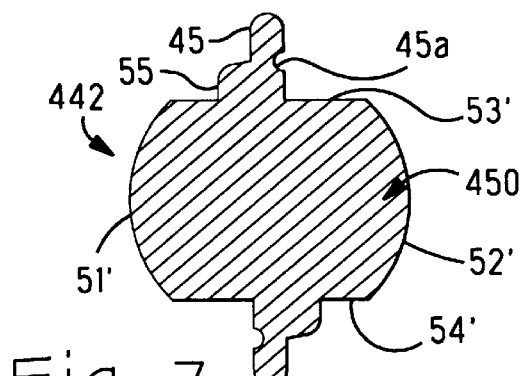
FIG. 6 is a cross-sectional view of a third alternative embodiment of the press-fit connecting portion of the pin.
FIG. 7 is a cross-sectional view of a fourth alternative embodiment of the press-fit connecting portion of the pin.

In the press-fit connecting pin shown in FIG. 6, the base parts are formed on the central portions of the parallel surfaces 53', 54' and the tips of these base parts are positioned on the circumference of the inner circle described above. Projecting strips 45 are formed radially in the center of the tip of each base part; however, a semicircular cut-out 45a (e.g., with a radius of approximately 0.015 mm) is formed in the root portion on the right side of each protecting strip 45. As a result of the formation of such cut-outs 45a, a force that causes the projecting strips 45 to bend toward the side in which the cut-out 45a is formed, i.e., to bend in the clockwise direction as shown in these figures, acts on the projecting strips 45 when the pin 10 is press-fitted in the through-hole 101. Accordingly, an effect similar to that obtained with the embodiment shown in FIGS. 4 and 5 may be expected.

The embodiment shown in FIG. 7 is similar to the embodiment shown in FIG. 6; however, this embodiment differs from the embodiment shown in FIG. 6 in that the base parts 55a, 56a are offset to one side (i.e., the opposite side from the side in which the cut-out 45a is formed). As a result of this shape, the projecting strips 45 have room or space to incline even further in the clockwise direction. Accordingly, the projecting strips 45 can be sufficiently bent even in the case of a relatively small-diameter through-hole 101 so that press-fitting and connection can be accomplished relatively smoothly without any great damage to the through-hole 101.

The press-fit connection pin 10 of the present invention was described above in detail along with various examples of alternative embodiments. However, the present invention is not limited to such embodiments alone; it goes without saying that various modifications and alterations may be made in accordance with intended uses without departing from the spirit of the present invention.

Figure 8:
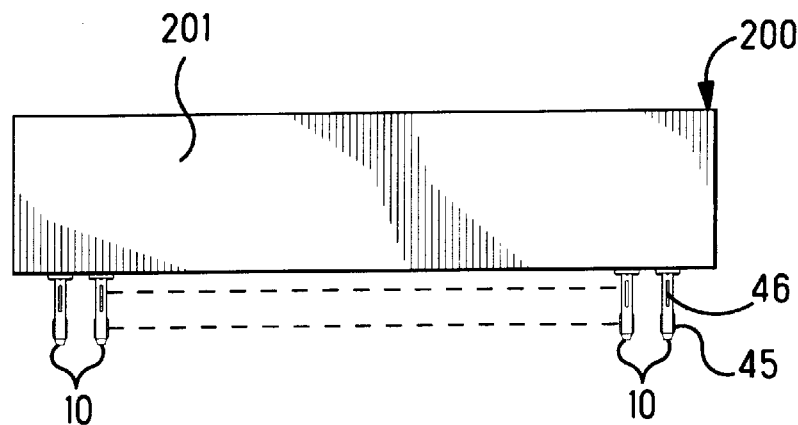
FIG. 8 is a front view of the electronic device of the present invention.
Figure 9:
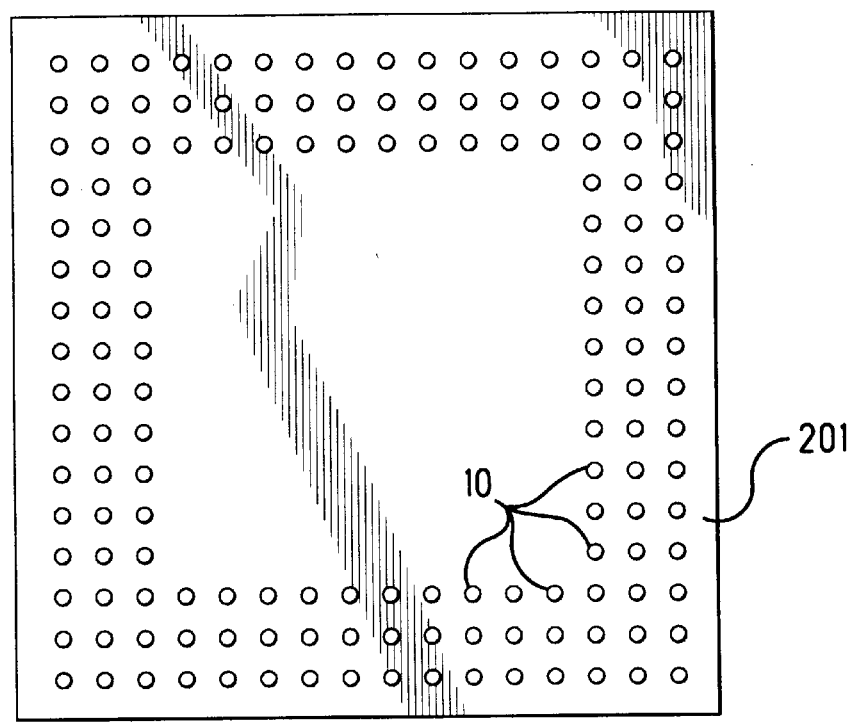
FIG. 9 is a bottom view of the device of FIG. 8.

An electronic device using the press-fit connecting pin 10 of the present invention will be briefly described with reference to FIGS. 8 and 9. FIG. 8 is a side view of the electronic device 200 and FIG. 9 is a bottom view of the same. The electronic device 200 shown here as an example is a device which is commonly known as a "P-PGA" (plastic pin grid array). In this electronic device 200, various types of semiconductor integrated circuits (IC's) and the like are installed and connected on the surface of a plastic substrate and the overall device is sealed with a plastic material (e.g., an epoxy resin). Numerous press-fit connecting pins 10 are disposed in a matrix form on the bottom surface of the main body 201 of the electronic device 200.

The respective press-fit connecting pins 10 may be any of the pins described above with reference to FIGS. 1 through 7. The cylindrical portions 30 of the pins 10 are connected by welding or the like to conductive pads on the plastic substrate so that the pins 10 are electrically connected to specified circuits of the various IC's described above. In the case of an electronic device 200 that thus has numerous interconnected pins, it is extremely desirable to use press-fit connecting pins 10 in order to facilitate attachment and connection to the circuit board and for other reasons. In the past, such a need or requirement existed, but no electronic device capable of realizing such connections had been concretely proposed. By using the press-fit connecting pins 10 described above, it has become possible for the first time to realize such connections. Furthermore, it is desirable that the press-fit connecting pins 10 be made of a good conductor of electricity and heat, such as a copper-alloy or the like.

As is seen from the above description, the use of the press-fit connecting pin of the present invention makes it possible, as a result of the special construction of the pin to insert the pin into the through-hole of a circuit board by means of a low insertion force, so that damage to the plating layer on the inside walls of the through-hole can be alleviated. Furthermore, a sufficiently reliable electrical connection with the through-hole can also be obtained. Furthermore, the pin of the present invention can also be used in cases where the through-holes involved have a relatively large dimensional tolerance (e.g., =0.05 mm). Accordingly, the present invention has the conspicuous practical merit of making it possible to connect electronic devices with large numbers of pins installed at a high density to circuit boards.

We claim:

1. A press-fit connecting pin that is press-fitted in a plated through-hole formed in a circuit board, the pin including a long, slender shaft portion having deformable strips that project radially from the shaft portion and are disposed thereon at separate locations, the locations being angularly positioned with respect to one another, the projecting strips being formed so that they can engage the inside walls of the through-hole, the strips being deformable upon insertion of the pin into the through-hole of the board; the press-fit connecting pin being characterized in that:

the shaft portion includes first and second sections formed longitudinally therealong each having the projecting strips, the first section having projecting strips disposed at different angular locations with respect to the projecting strips of the second section such that the projecting strips of the first and second sections are mutually angularly offset.

2. An electronic device which has a plurality of press-fit connecting pins that are press-fitted and connected in plated through-holes, said electronic device being characterized in that:

said press-fit connecting pins have the construction described in claim 1.

3. A connecting pin as set forth in claim 1 wherein the connecting pin shaft portion is of one-piece construction.

4. A connecting pin as set forth in claim 1 wherein the projecting strips have deformable end portions extending outwardly from base portions and are thin and elongated, and the shaft portion includes clearance recesses adjacent to the projecting strips, such that the deformable end portions are deformable laterally into respective clearance recesses.

5. A connecting pin as set forth in claim 4 wherein the projecting strips include undercuts at the base portions to facilitate deformation.

6. A connecting pin as set forth in claim 4 wherein the connecting pin shaft portion inclusive of the projecting strips is of one-piece construction.

7. A connecting pin as set forth in claim 4 wherein the deformable end portions extend at an angle from their base portions.

8. A connecting pin as set forth in claim 7 wherein the angle is a right angle.

9. A connecting pin as set forth in claim 4 wherein the base portions of the projecting strips are laterally offset in opposed directions from centers of the respective opposed sides of the shaft portion.

10. A connecting pin as set forth in claim 9 wherein said deformable end portions are laterally offset from centers of the respective base portions and toward the centers of the opposed sides of the shaft portion.

11. A press-fit connecting pin that is press-fitted in a plated through-hole formed in a circuit board, the pin including a long, slender shaft portion having deformable strips that project radially from the shaft portion and are disposed thereon at separate locations, the locations being angularly positioned with respect to one another, the projecting strips being formed so that they can engage the inside walls of the through-hole, the strips being deformable upon insertion of the pin into the through-hole of the board; the press-fit connecting pin being characterized in that:

the shaft portion is substantially round and includes first and second sections formed longitudinally therealong each having the projecting strips, the first section having projecting strips disposed at different angular locations with respect to the projecting strips of the second section such that the projecting strips of the first and second sections are mutually angularly offset; each section including a pair of opposed substantially parallel surfaces formed on two sides thereof; and the deformable strips extend from the approximate centers of the parallel surfaces and project in a radial configuration outwardly beyond the diameter of the remaining shaft portion.

12. An electronic device which has a plurality of press-fit connecting pins that are press-fitted and connected in plated through-holes, said electronic device being characterized in that:

said press-fit connecting pins have the construction described in claim 11.

13. A connecting pin as set forth in claim 11 wherein the connecting pin shaft portion is of one-piece construction.

14. A connecting pin as set forth in claim 11 wherein the projecting strips have deformable end portions extending outwardly from base portions and are thin and elongated, and the shaft portion includes clearance recesses adjacent to the projecting strips, such that the deformable end portions are deformable laterally into respective clearance recesses.

15. A connecting pin as set forth in claim 14 wherein the projecting strips include undercuts at the base portions of the deformable end portions to facilitate deformation.

16. A connecting pin as set forth in claim 14 wherein the connecting pin shaft portion inclusive of the projecting strips is of one-piece construction.

17. A connecting pin as set forth in claim 14 wherein the base portions of the projecting strips are laterally offset in opposed directions from centers of the respective opposed sides of the shaft portion.

18. A connecting pin as set forth in claim 7 wherein said deformable free end portions are laterally offset from centers of the respective base portions and toward the centers of the opposed sides of the shaft portion.

19. A connecting pin as set forth in claim 14 wherein the deformable end portions extend at an angle from their base portions.

20. A connecting pin as set forth in claim 19 wherein the angle is a right angle.

* * * * *